United States Patent
Liu

(10) Patent No.: US 11,868,150 B2
(45) Date of Patent: Jan. 9, 2024

(54) VOLTAGE CONTROL OSCILLATOR APPARATUS AND POWER SUPPLY STABILIZING CIRCUIT OF THE SAME

(71) Applicant: REALTEK SEMICONDUCTOR CORPORATION, Hsinchu (TW)

(72) Inventor: Hsi-En Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/847,229

(22) Filed: Jun. 23, 2022

(65) Prior Publication Data
US 2022/0413530 A1 Dec. 29, 2022

(30) Foreign Application Priority Data

Jun. 25, 2021 (TW) ................................. 110123409

(51) Int. Cl.
*G05F 1/56* (2006.01)
*H03K 3/03* (2006.01)
(52) U.S. Cl.
CPC ............. *G05F 1/56* (2013.01); *H03K 3/0315* (2013.01)
(58) Field of Classification Search
CPC ................................ G05F 1/56; H03K 3/0315
USPC ............................ 331/175, 185, 182, 183, 57
See application file for complete search history.

(56) References Cited

U.S. PATENT DOCUMENTS

| 7,973,612 | B2 | 7/2011 | Raghunathan et al. |
| 8,022,744 | B2 * | 9/2011 | Lalithambika ............ G05F 3/30 327/543 |
| 8,111,093 | B2 | 2/2012 | Poulton et al. |

(Continued)

FOREIGN PATENT DOCUMENTS

| CN | 102843132 B | 11/2015 |
| CN | 103460603 B | 3/2017 |
| WO | WO2007040928 A1 | 4/2007 |

OTHER PUBLICATIONS

Elad Alon et al., "Replica compensated linear regulators for supply-regulated phase-locked loops", Feb. 2006, pp. 413-424, vol. 41, No. 2, IEEE Journal of Solid-State Circuits.

(Continued)

*Primary Examiner* — Arnold M Kinkead
(74) *Attorney, Agent, or Firm* — WPAT, PC

(57) ABSTRACT

The present invention discloses a power supply stabilizing circuit having noise suppressing mechanism configured to drive a voltage-control oscillating circuit that includes a current-adjusting N-type transistor including a drain, a source and a gate and an adjusting voltage generation circuit. The drain receives a first operation voltage. The source generates a power signal to the voltage control oscillator circuit. The gate receives an adjusting voltage. The adjusting voltage generation circuit operates according to a second operation voltage higher than the first operation voltage and receives a reference voltage that is a division of the first operation voltage to generate the adjusting voltage. The adjusting voltage is a sum of the reference voltage and a threshold voltage of the current-adjusting N-type transistor such that the current-adjusting N-type transistor operates in a saturation region to keep a current variation amount of the power signal smaller than a predetermined value.

18 Claims, 2 Drawing Sheets

(56) References Cited

U.S. PATENT DOCUMENTS 8,362,848 B2     1/2013 Raghunathan et al.

OTHER PUBLICATIONS

Adrian Maxim et al., "A low-jitter 125-1250-MHz process-independent and ripple-poleless 0.18-µm CMOS PLL based on a sample-reset loop filter", Nov. 2001, pp. 1673-1683, vol. 36, No. 11, IEEE Journal of Solid-State Circuits.
OA letter of a counterpart TW application (appl. No. 110123409) dated Mar. 8, 2022. Summary of the TW OA letter: 1. Claims 1 and 8-10 are rejected as allegedly being unpatentable (CN 102843132B). 2. Claim 7 is rejected as allegedly being unpatentable (CN 103460603B, also published as U.S. Pat. No. 8,362,848B2). 3. Claims 2~6 are allowable. Correspondence bewteen claims of TW counterpart application and claims of U.S. Appl. No.: 1. Claims 1, 2-3, . . . , and 10 in TW counterpart application correspond to claims 1, 2-3, . . . and 10 in U.S. Appl. No., respectively.

\* cited by examiner

VOLTAGE CONTROL OSCILLATOR APPARATUS AND POWER SUPPLY STABILIZING CIRCUIT OF THE SAME

BACKGROUND OF THE INVENTION

1. Field of the Invention

The present invention relates to a voltage control oscillator apparatus and a power supply stabilizing circuit of the same.

2. Description of Related Art

In a phase lock loop (PLL) circuit and a clock and data recovery (CDR) circuit, a voltage control oscillator is disposed therein to provide an oscillating signal having an oscillating frequency such that a feedback mechanism is applied to lock a phase or a frequency. The voltage control oscillator is able to vary the oscillating frequency of the oscillating signal by adjusting a control voltage.

A jitter often occurs in the signal generated by the voltage control oscillator due to noise. A low dropout regulator (LDO) circuit is common to be used to perform voltage stabilizing on the signal generated by the voltage control oscillator. However, under the progress of the manufacturing process, the voltage that the components in a circuit can withstand becomes smaller such that the headroom becomes insufficient. Further, the low dropout regulator circuit operates to provide filtering activity according to a feedback mechanism provided by an operational amplifier. Such a design results in large area and large power dissipation. Furthermore, the noise of the operational amplifier itself also affects the performance of the voltage control oscillator.

SUMMARY OF THE INVENTION

In consideration of the problem of the prior art, an object of the present invention is to supply a voltage control oscillator apparatus and a power supply stabilizing circuit of the same.

The present invention discloses a power supply stabilizing circuit having noise suppressing mechanism used to drive a voltage control oscillator circuit that includes a current-adjusting N-type transistor and an adjusting voltage generation circuit. The current-adjusting N-type transistor includes a drain, a source and a gate. The drain is configured to receive a first operation voltage. The source is configured to generate a power signal to the voltage control oscillator circuit such that the voltage control oscillator circuit operates according to the power signal. The gate is configured to receive an adjusting voltage. The adjusting voltage generation circuit is configured to operate according to a second operation voltage higher than the first operation voltage and receives a reference voltage that is a division of the first operation voltage to generate the adjusting voltage, wherein the adjusting voltage is a sum of the reference voltage and a threshold voltage of the current-adjusting N-type transistor such that the current-adjusting N-type transistor operates in a saturation region to keep a current variation amount of the power signal smaller than a current variation predetermined value.

The present invention also discloses a voltage control oscillator apparatus that includes a voltage control oscillator circuit and a power supply stabilizing circuit. The voltage control oscillator circuit operates according to a power signal. The power supply stabilizing circuit includes a current-adjusting N-type transistor and an adjusting voltage generation circuit. The current-adjusting N-type transistor includes a drain, a source and a gate. The drain is configured to receive a first operation voltage. The source is configured to generate the power signal to the voltage control oscillator circuit. The gate is configured to receive an adjusting voltage. The adjusting voltage generation circuit is configured to operate according to a second operation voltage higher than the first operation voltage and receives a reference voltage that is a division of the first operation voltage to generate the adjusting voltage, wherein the adjusting voltage is a sum of the reference voltage and a threshold voltage of the current-adjusting N-type transistor such that the current-adjusting N-type transistor operates in a saturation region to keep a current variation amount of the power signal smaller than a current variation predetermined value.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a voltage control oscillator apparatus and a power supply stabilizing circuit of the same to generate a power signal that is stable, without interference and having enough headroom to a voltage control oscillator circuit such that the voltage control oscillator circuit steadily outputs an oscillating signal having an oscillating frequency.

Figure 1:
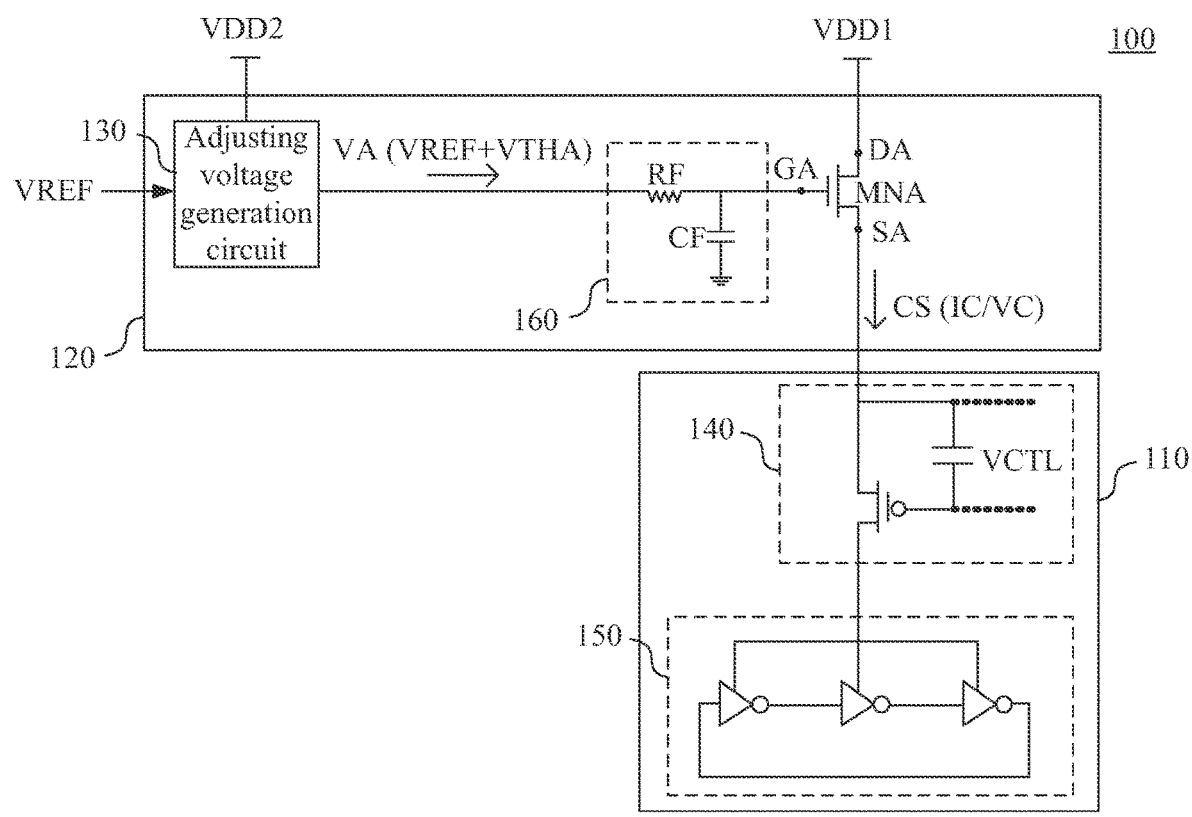
FIG. 1 illustrates a block diagram of a voltage control oscillator apparatus according to an embodiment of the present invention.

Reference is now made to FIG. 1. FIG. 1 illustrates a block diagram of a voltage control oscillator apparatus 100 according to an embodiment of the present invention. The voltage control oscillator apparatus 100 includes a voltage control oscillator circuit 110 and a power supply stabilizing circuit 120.

The voltage control oscillator circuit 110 is configured to receive a power signal CS and operates according to the power signal CS. In an embodiment, the voltage control oscillator circuit 110 includes a control voltage receiving circuit 140 and an oscillator 150. The control voltage receiving circuit 140 is configured to receive a control voltage VCTL such that the oscillator 150 generates an oscillating signal (not illustrated in the figure) having different oscillating frequencies according to the variation of the control voltage VCTL.

In an embodiment, the voltage control oscillator circuit 110 is applied to such as, but not limited to a phase lock loop (PLL) circuit, a clock and data recovery (CDR) circuit or other circuits that provides phase-locking or frequency-locking technology based on feedback mechanism. The voltage control oscillator circuit 110 may receive the control voltage VCTL according to the other circuit modules in these circuits to determine the amount of the oscillating frequency of the oscillating signal.

It is appreciated that the circuit configuration of each of the control voltage receiving circuit 140 and the oscillator 150 illustrated in FIG. 1 is merely an example. In other embodiments, the control voltage receiving circuit 140 and the oscillator 150 can be implemented by using other circuit configurations.

The power supply stabilizing circuit 120 includes a current-adjusting N-type transistor MNA and an adjusting voltage generation circuit 130.

The current-adjusting N-type transistor MNA includes a drain DA, a source SA and a gate GA. The drain DA is configured to receive a first operation voltage VDD1. In an embodiment, the first operation voltage VDD1 is 1.8 volts. The source SA is configured to generate a power signal CS to the voltage control oscillator circuit 110, wherein the power signal CS has a corresponding current IC and a corresponding voltage VC. The gate GA is configured to receive an adjusting voltage VA.

The adjusting voltage generation circuit 130 is configured to generate the adjusting voltage VA. In an embodiment, the power supply stabilizing circuit 120 may selectively include a filter circuit 160 disposed on a path that the adjusting voltage generation circuit 130 generates the adjusting voltage VA to the gate GA of the current-adjusting N-type transistor MNA to filter and stabilize the adjusting voltage VA. In an embodiment, the filter circuit 160 can be a RC circuit including a resistor RF and a capacitor CF as illustrated in FIG. 1. However the present invention is not limited thereto.

The adjusting voltage generation circuit 130 operates according to a second operation voltage VDD2 higher than the first operation voltage VDD1. In an embodiment, the second operation voltage VDD2 is 3.3 volts. Furthermore, the adjusting voltage generation circuit 130 receives a reference voltage VREF that is a division of the first operation voltage VDD1 to generate the adjusting voltage VA.

The adjusting voltage VA is a sum of the reference voltage VREF and a threshold voltage VTHA of the current-adjusting N-type transistor MNA, which is denoted as VA=VREF+VTHA. As a result, the current-adjusting N-type transistor MNA operates in a saturation region to keep a current variation amount of current IC that the power signal CS corresponds to smaller than a current variation predetermined value.

In an embodiment, for the first operation voltage VDD1, the current-adjusting N-type transistor MNA has high impedance. Under such a condition, the current IC that the power signal CS corresponds to is defined by the control voltage VCTL described above. Further, since the current-adjusting N-type transistor MNA is controlled by the voltage the adjusting voltage VA that is stable relative to a ground terminal, the voltage VC of the power signal CS is defined by the current IC and a voltage difference between the gate and the source of the current-adjusting N-type transistor MNA.

As a result, since for a circuit external to the current-adjusting N-type transistor MNA, the drain DA of the current-adjusting N-type transistor MNA has high impedance that can efficiently suppress the interference caused by the noise generated due to the variation of the first operation voltage VDD1, in which such a variation occurs due to the variation of manufacturing process, voltage and temperature (PVT). As a result, the current variation amount of the current IC can be smaller than the current variation predetermined value such that the voltage variation amount of the voltage VC is smaller than the voltage variation predetermined value.

Figure 2:
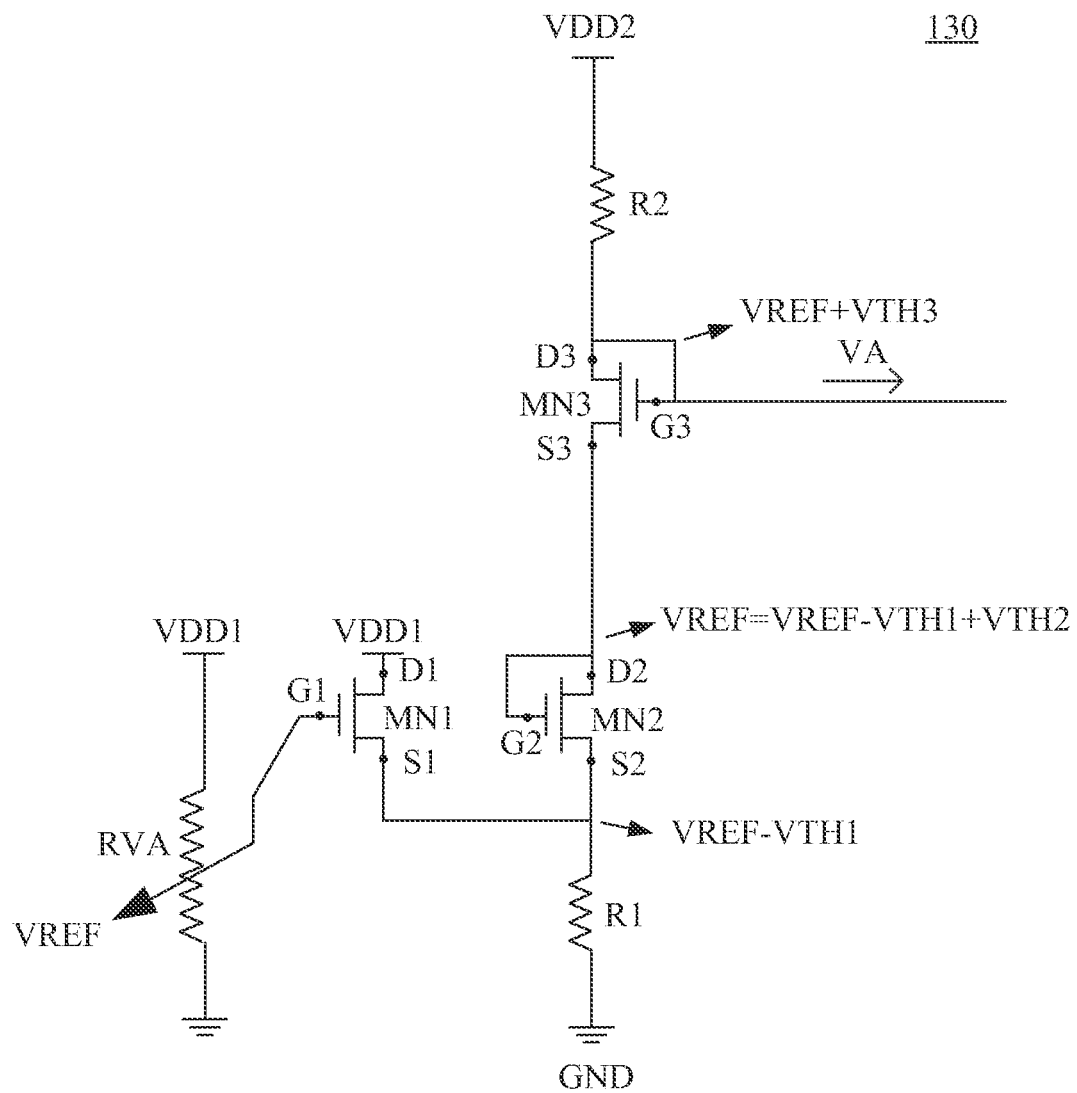
FIG. 2 illustrates a circuit diagram of the adjusting voltage generation circuit according to an embodiment of the present invention.

Reference is now made to FIG. 2. FIG. 2 illustrates a circuit diagram of the adjusting voltage generation circuit 130 according to an embodiment of the present invention. The adjusting voltage generation circuit 130 includes a first resistor R1, a second resistor R2, a first N-type transistor MN1, a second N-type transistor MN2 and a third N-type transistor MN3.

The first N-type transistor MN1 includes a drain D1, a source S1 and a gate G1. The drain D1 is configured to receive the first operation voltage VDD1. The source S1 is electrically coupled to a ground terminal GND through the first resistor R1. The gate G1 is configured to receive the reference voltage VREF.

The reference voltage VREF is a division of the first operation voltage VDD1. In an embodiment, an amount of reference voltage VREF can 80% to 90% of an amount of the first operation voltage VDD1. Take the first operation voltage VDD1 having the amount of 1.8 volts as an example, the amount of the reference voltage VREF can be smaller than the first operation voltage VDD1 for 200 millivolts to 300 millivolt, which is 1.5 volts to 1.6 volts. Such an amount can keep the current-adjusting N-type transistor MNA operate in the saturation region even if interference from the first operation voltage VDD1 occurs. The power noise can be efficiently suppressed.

In an embodiment, the reference voltage VREF is generated by a variable resistor circuit RVA that receives and divides the first operation voltage VDD1. The variable resistor circuit RVA can be disposed in the adjusting voltage generation circuit 130 or independently outside of the adjusting voltage generation circuit 130. In other embodiments, the reference voltage VREF can be generated by using other types of voltage-dividing circuit or other voltage-generating circuits that is able to generate the desired reference voltage VREF.

The second N-type transistor MN2 includes a drain D2, a source S2 and a gate G2. The source S2 is electrically coupled to the ground terminal GND through the first resistor R1. The gate G2 and the drain D2 are electrically coupled together such that the second N-type transistor MN2 becomes a diode-connected transistor.

The third N-type transistor MN3 includes a drain D3, a source S3 and a gate G3. The drain D3 receives the second operation voltage VDD2 through the second resistor R2. In an embodiment, the second operation voltage VDD2 is 3.3 volts. The source S3 is electrically coupled to the drain D2 of the second N-type transistor MN2. The gate G3 and the drain D3 are electrically coupled together such that the third N-type transistor MN3 becomes a diode-connected transistor.

Further, the gate G3 and the gate GA of the current-adjusting N-type transistor MNA in FIG. 1 are electrically coupled to output the adjusting voltage VA.

In operation, the resistances of the first resistor R1 and second resistor R2 make each of the first N-type transistor MN1, the second N-type transistor MN2 and the third N-type transistor MN3 operates in a weak-inversion region.

Due to the operation in the weak-inversion region, the first N-type transistor MN1 generates a tiny amount of current such that a voltage difference between the gate G1 and the source S1 of the first N-type transistor MN1 is substantially the threshold voltage VTH1 of the first N-type transistor MN1. Under such a condition, the voltage of the source S1 is substantially VREF-VTH1. It is appreciated that the term "substantially" means that the voltage difference does not necessarily exactly equal to threshold voltage VTH1 and may include a reasonable offset.

The voltage of the source S2 of the second N-type transistor MN2 is the same as the voltage of the source S2, which is VREF-VTH1. Due to the operation in the weak-inversion region, the second N-type transistor MN2 generates a tiny amount of current such that a voltage difference between the gate G2 and the source S2 is substantially the threshold voltage VTH2 of the second N-type transistor MN2. It is appreciated that the term "substantially" means that the voltage difference does not necessarily exactly equal to threshold voltage VTH2 and may include a reasonable offset.

In an embodiment, the second N-type transistor MN2 and the first N-type transistor MN1 match each other such that the threshold voltage VTH2 of the second N-type transistor MN2 is the same as the threshold voltage VTH1 of the first N-type transistor MN1, i.e., VTH1=VTH2. As a result, the voltage of the gate G2 of the second N-type transistor MN2 is VREF-VTH1+VTH2=VREF. Furthermore, since the gate G2 and the drain D2 of the second N-type transistor MN2 are electrically coupled together, the voltage of the drain D2 is also VREF.

Due to the operation in the weak-inversion region, the third N-type transistor MN3 generates a tiny amount of current such that a voltage difference between the gate G3 and the source S3 is substantially the threshold voltage VTH3 of the third N-type transistor MN3. It is appreciated that the term "substantially" means that the voltage difference does not necessarily exactly equal to threshold voltage VTH3 and may include a reasonable offset.

The threshold voltage VTH3 is not necessarily the same as the threshold voltage VTH1 and the threshold voltage VTH2. As a result, the voltage of the gate G3 of the third N-type transistor MN3 is VREF+VTH3. Furthermore, since the gate G3 and the drain D3 of the third N-type transistor MN3 are electrically coupled together, the voltage of the drain D3 is also VREF+VTH3.

Since the voltage that the gate G3 of the third N-type transistor MN3 generates is the adjusting voltage VA, the adjusting voltage VA is VREF+VTH3. In an embodiment, the third N-type transistor MN3 and the current-adjusting N-type transistor MNA match each other such that the threshold voltage VTH3 of the third N-type transistor MN3 is the same as the threshold voltage VTHA of the current-adjusting N-type transistor MNA, i.e., VTH3=VTHA. As a result, the adjusting voltage VA can be expressed as VREF+VTHA. Furthermore, the voltage VC of the power signal CS generated by the source SA of the current-adjusting N-type transistor MNA in FIG. 1 becomes VREF+VTHA−VTHA=VREF.

Since the adjusting voltage generation circuit 130 used to generate the adjusting voltage VA operates in the second operation voltage VDD2 higher than the first operation voltage VDD1, the voltage VC of the power signal CS has enough headroom. Further, each of the transistors in the power supply stabilizing circuit 120 does not withstand a voltage over 1.8 volts.

As a result, the power supply stabilizing circuit 120 of the present invention provides the stable adjusting voltage VA by using a configuration having all N-type transistors to control the current-adjusting N-type transistor MNA having high impedance relative to the first operation voltage VDD1 to generate the power signal CS having the stable current IC.

The voltage VC of the power signal CS thus is not varied due to noise of the first operation voltage VDD1 and has enough headroom at the same time.

In an embodiment, each of the third N-type transistor MN3 in FIG. 2 and the current-adjusting N-type transistor MNA in FIG. 1 can be a common transistor. However, when a limit of a withstanding voltage exists, each of the third N-type transistor MN3 in FIG. 2 and the current-adjusting N-type transistor MNA may include a deep N well such that an voltage-exceeding issue can be avoided when the circuit turns off.

It is appreciated that the embodiments described above are merely an example. In other embodiments, it should be appreciated that many modifications and changes may be made by those of ordinary skill in the art without departing from the spirit of the disclosure.

In summary, the present invention discloses the voltage control oscillator apparatus and the power supply stabilizing circuit of the same to generate a power signal that is stable, without interference and having enough headroom to a voltage control oscillator circuit such that the voltage control oscillator circuit steadily outputs an oscillating signal having an oscillating frequency.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A power supply stabilizing circuit having noise suppressing mechanism used to drive a voltage control oscillator circuit, comprising:
    a current-adjusting N-type transistor comprising:
        a drain configured to receive a first operation voltage;
        a source configured to generate a power signal to the voltage control oscillator circuit such that the voltage control oscillator circuit operates according to the power signal; and
        a gate configured to receive an adjusting voltage;
    a variable resistor circuit configured to receive and divide the first operation voltage to output a reference voltage; and
    an adjusting voltage generation circuit configured to operate according to a second operation voltage higher than the first operation voltage and receives the reference voltage that is a division of the first operation voltage to generate the adjusting voltage, wherein the adjusting voltage is a sum of the reference voltage and a threshold voltage of the current-adjusting N-type transistor such that the current-adjusting N-type transistor operates in a saturation region to keep a current variation amount of the power signal smaller than a current variation predetermined value.

2. The power supply stabilizing circuit of claim 1, wherein the adjusting voltage generation circuit further comprises:
    a first resistor and a second resistor;
    a first N-type transistor comprising:
        a drain configured to receive the first operation voltage;
        a source electrically coupled to a ground terminal through the first resistor; and
        a gate configured to receive the reference voltage;
    a second N-type transistor matching the first N-type transistor and comprising:
        a drain;

a source electrically coupled to the ground terminal through the first resistor; and
a gate electrically coupled to the drain of the second N-type transistor; and
a third N-type transistor matching the current-adjusting N-type transistor and comprising:
a drain configured to receive the second operation voltage through the second resistor;
a source electrically coupled to the drain of the second N-type transistor; and
a gate electrically coupled to the drain of the third N-type transistor, and electrically coupled to the gate of the current-adjusting N-type transistor to output the adjusting voltage;
wherein a resistance of each of the first resistor and the second resistor makes each of the first N-type transistor, the second N-type transistor and the third N-type transistor operates in a weak-inversion region.

3. The power supply stabilizing circuit of claim 2, wherein a first voltage of the source of each of the first N-type transistor and the second N-type transistor is a difference between the reference voltage and a threshold voltage of the first N-type transistor, a second voltage of the drain of the second N-type transistor is the reference voltage, a third voltage of each of the gate and the drain of the third N-type transistor is a sum of the reference voltage and a threshold voltage of the third N-type transistor, and a fourth voltage of the power signal corresponding to the source of the current-adjusting N-type transistor is the reference voltage.

4. The power supply stabilizing circuit of claim 2, wherein the variable resistor circuit is configured to output the reference voltage to the gate of the first N-type transistor.

5. The power supply stabilizing circuit of claim 2, wherein an amount of the reference voltage is 80% to 90% of an amount of the first operation voltage.

6. The power supply stabilizing circuit of claim 2, wherein each of the third N-type transistor and the current-adjusting N-type transistor comprises a deep N well.

7. The power supply stabilizing circuit of claim 1, further comprising a filter circuit disposed on a path that the adjusting voltage generation circuit generates the adjusting voltage to the gate of the current-adjusting N-type transistor.

8. The power supply stabilizing circuit of claim 1, wherein a voltage variation amount of the power signal is smaller than a voltage variation predetermined value.

9. The power supply stabilizing circuit of claim 1, wherein for the first operation voltage, the current-adjusting N-type transistor has high impedance.

10. A voltage control oscillator apparatus comprising:
a voltage control oscillator circuit that operates according to a power signal; and
a power supply stabilizing circuit comprising:
a current-adjusting N-type transistor comprising:
a drain configured to receive a first operation voltage;
a source configured to generate the power signal to the voltage control oscillator circuit; and
a gate configured to receive an adjusting voltage;
a variable resistor circuit configured to receive and divide the first operation voltage to output a reference voltage; and
an adjusting voltage generation circuit configured to operate according to a second operation voltage higher than the first operation voltage and receives a reference voltage that is a division of the first operation voltage to generate the adjusting voltage, wherein the adjusting voltage is a sum of the reference voltage and a threshold voltage of the current-adjusting N-type transistor such that the current-adjusting N-type transistor operates in a saturation region to keep a current variation amount of the power signal smaller than a current variation predetermined value.

11. The voltage control oscillator apparatus of claim 10, wherein the adjusting voltage generation circuit further comprises:
a first resistor and a second resistor;
a first N-type transistor comprising:
a drain configured to receive the first operation voltage;
a source electrically coupled to a ground terminal through the first resistor; and
a gate configured to receive the reference voltage;
a second N-type transistor matching the first N-type transistor and comprising:
a drain;
a source electrically coupled to the ground terminal through the first resistor; and
a gate electrically coupled to the drain of the second N-type transistor; and
a third N-type transistor matching the current-adjusting N-type transistor and comprising:
a drain configured to receive the second operation voltage through the second resistor;
a source electrically coupled to the drain of the second N-type transistor; and
a gate electrically coupled to the drain of the third N-type transistor, and electrically coupled to the gate of the current-adjusting N-type transistor to output the adjusting voltage;
wherein resistances of the first resistor and the second resistor make each of the first N-type transistor, the second N-type transistor and the third N-type transistor operates in a weak-inversion region.

12. The voltage control oscillator apparatus of claim 11, wherein a first voltage of the source of each of the first N-type transistor and the second N-type transistor is a difference between the reference voltage and a threshold voltage of the first N-type transistor, a second voltage of the drain of the second N-type transistor is the reference voltage, a third voltage of each of the gate and the drain of the third N-type transistor is a sum of the reference voltage and a threshold voltage of the third N-type transistor, and a fourth voltage of the power signal corresponding to the source of the current-adjusting N-type transistor is the reference voltage.

13. The voltage control oscillator apparatus of claim 11, wherein the power supply stabilizing circuit further comprises a variable resistor circuit configured to receive and divide the first operation voltage to output the reference voltage to the gate of the first N-type transistor.

14. The voltage control oscillator apparatus of claim 11, wherein an amount of the reference voltage is 80% to 90% of an amount of the first operation voltage.

15. The voltage control oscillator apparatus of claim 11, wherein each of the third N-type transistor and the current-adjusting N-type transistor comprises a deep N well.

16. The voltage control oscillator apparatus of claim 10, wherein the power supply stabilizing circuit further comprises a filter circuit disposed on a path that the adjusting voltage generation circuit generates the adjusting voltage to the gate of the current-adjusting N-type transistor.

17. The voltage control oscillator apparatus of claim 10, wherein a voltage variation amount of the power signal is smaller than a voltage variation predetermined value.

18. The voltage control oscillator apparatus of claim 10, wherein for the first operation voltage, the current-adjusting N-type transistor has high impedance.

\* \* \* \* \*